(12) United States Patent
Kim

(10) Patent No.: US 7,960,902 B2
(45) Date of Patent: Jun. 14, 2011

(54) ORGANIC LIGHT EMITTING DIODE DISPLAY AND METHOD OF MANUFACTURING THE SAME

(75) Inventor: Eun-Ah Kim, Yongin (KR)

(73) Assignee: Samsung Mobile Display Co., Ltd., Youngin, Gyunggi-do (KR)

( * ) Notice: Subject to any disclaimer, the term of this patent is extended or adjusted under 35 U.S.C. 154(b) by 62 days.

(21) Appl. No.: 12/458,757

(22) Filed: Jul. 22, 2009

(65) Prior Publication Data
US 2010/0019662 A1     Jan. 28, 2010

(30) Foreign Application Priority Data
Jul. 22, 2008   (KR) .................. 10-2008-0071157

(51) Int. Cl.
*H01J 5/16*     (2006.01)
(52) U.S. Cl. .................. 313/110; 313/506; 313/512
(58) Field of Classification Search .................. 313/110, 313/498, 504, 506, 512
See application file for complete search history.

(56) References Cited

U.S. PATENT DOCUMENTS
6,284,342 B1 *   9/2001   Ebisawa et al. ................. 428/69
6,975,067 B2 * 12/2005   McCormick et al. ......... 313/512
* cited by examiner

*Primary Examiner* — Vip Patel
(74) *Attorney, Agent, or Firm* — Lee & Morse, P.C.

(57) ABSTRACT

An OLED display includes a first substrate and a second substrate adhered to the first substrate wherein a depressed receiving region and a coupling region formed around a receiving region are provided at an opposite surface to a surface facing the first substrate, a first optical film received in the depressed receiving region of the second substrate, a second optical film covering the first optical film and is disposed on the second substrate, and a coupling region adhesive layer is disposed between the second optical film and the coupling region of the second substrate.

9 Claims, 5 Drawing Sheets

ORGANIC LIGHT EMITTING DIODE DISPLAY AND METHOD OF MANUFACTURING THE SAME

BACKGROUND OF THE INVENTION

1. Field of the Invention

Embodiments relate to an organic light emitting diode (OLED) display and a method of manufacturing the same. More particularly, the embodiments relate to an OLED display that is designed to be slimmer and a method of manufacturing the same.

2. Description of the Related Art

An OLED display includes a plurality of OLEDs each having a hole injection electrode, an organic light emitting layer, and an electron injection electrode. The OLEDs emit light using energy generated when excitons generated by electron-hole combination in the organic light emitting layer drop from the excitation state to the ground state. The OLED display forms an image using the light emitted from the OLEDs.

Therefore, the OLED display has a self-emissive characteristic. Unlike a liquid crystal display (LCD), the OLED display does not require a separate light source and thus, the thickness and weight thereof can be reduced. Further, the OLED display has a variety of high quality properties, e.g., low power consumption, high luminance, and quick response. Therefore, the OLED displays are drawing attention as the next alternative display for portable electronic devices.

Generally, in the OLED display, the representation of a black color and contrast deteriorate due to reflection of external light on electrodes of the OLEDs. Therefore, the OLED display further includes a variety of optical films, e.g., a polarizer film and a phase delay film, to suppress the external light reflection.

The optical films are attached to an outer surface of a substrate by adhesive layers. Therefore, the thickness of the OLED display having the optical films increases by the combined thickness of the optical films and adhesive layers.

The above information disclosed in this Background section is only for enhancement of understanding of the background of the invention, and therefore it may contain information that does not form the prior art that is already known in this country to a person of ordinary skill in the art.

SUMMARY OF THE INVENTION

It is therefore a feature of an embodiment to provide an OLED display that is designed to be slimmer and a method of manufacturing the same.

At least one of the above and other features and advantages may be realized by providing an OLED display includes a first substrate and a second substrate adhered to the first substrate wherein a depressed receiving region and a coupling region formed around a receiving region are provided at an opposite surface to a surface facing the first substrate, a first optical film received in the depressed receiving region of the second substrate, a second optical film covers the first optical film and is disposed on the second substrate and a coupling region adhesive layer disposed between the second optical film and the coupling region of the second substrate.

The first optical film may be a phase delay film and the second optical film may be a polarizer film.

A depth of the depressed receiving region may be substantially the same as a difference between a thickness of the first optical film and a thickness of the coupling region adhesive layer.

The OLED display may further include a receiving region adhesive layer disposed between the second substrate and the first optical film in the depressed receiving region.

A depth of the depressed receiving region may be substantially the same as a difference between a sum of the thickness of the first optical film and a thickness of the receiving region adhesive layer, and the thickness of the coupling region adhesive layer.

The OLED display may further include an inter-film adhesive layer disposed between the first optical film and the second optical film.

A depth of the depressed receiving region may be substantially the same as the thickness of a member received in the depressed receiving region.

The depressed receiving region may be an etched region.

The first substrate may include an organic light emitting diode.

At least one of the above and other features and advantages may be realized by providing a method of fabricating an OLED display including forming a depressed receiving region in a surface of a second substrate that is to be further from a first substrate, forming a coupling region around the receiving region, disposing a first optical film in the receiving region, disposing a second optical film on the second substrate, the second optical film covering the first optical film, and disposing a coupling region adhesive layer between the second optical film and the coupling region of the second substrate to attach the second optical film to the second substrate.

A depth of the depressed receiving region may be substantially the same as a difference between a thickness of the first optical film and a thickness of the coupling region adhesive layer.

The method of fabricating an OLED may further include disposing a receiving region adhesive layer between the second substrate and the first optical film in the depressed receiving region.

A depth of the depressed receiving region may be substantially the same as a difference between a sum of the thickness of the first optical film and a thickness of the receiving region adhesive layer, and the thickness of the coupling region adhesive layer.

The method of fabricating an OLED may further include disposing an inter-film adhesive layer between the first optical film and the second optical film.

A depth of the depressed receiving region may be substantially the same as the thickness of a member received in the depressed receiving region.

Forming the depressed receiving region may include etching the surface of the second substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
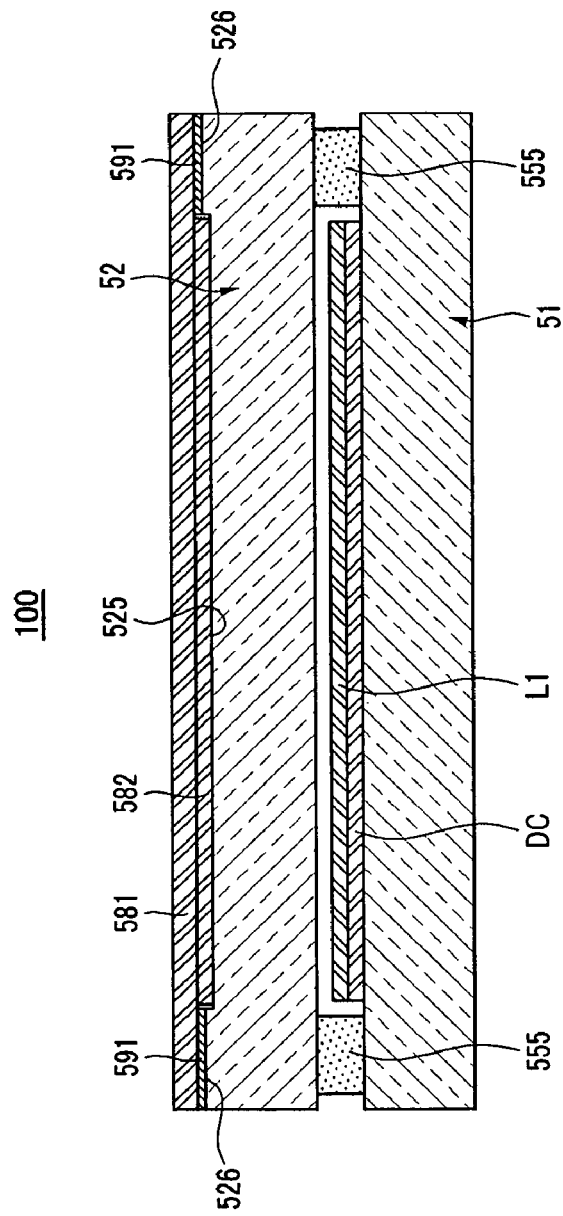
FIG. 1 illustrates a cross-sectional view of an OLED display according to a first exemplary embodiment.

Korean Patent Application No. 10-2008-0071157, filed on Jul. 22, 2008, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The following will describe a first exemplary embodiment with reference to FIG. 1.

As illustrated in FIG. 1, an OLED display 100 in accordance with a first exemplary embodiment may include a first substrate 51, a second substrate 52, a first optical film 582, a second optical film 581, and a coupling region adhesive layer 591.

The first substrate 51 may include a driving circuit DC and an OLED L1 that are sequentially formed on the first substrate member 51. However, the embodiment is not limited to this configuration. For example, the driving circuit DC and the OLED L1 may be formed on the second substrate 52.

The first and second substrates 51 and 52 may be joined together by a sealant 555. The sealant 555 may be disposed along peripheries of the first and second substrates 51 and 52, e.g., an each side end thereof, to join the first and second substrates 51 and 52 together. Generally, the second substrate 52 may be adhered to the first substrate 51 to cover and protect the driving circuit DC and the OLED L1 from external impact.

The second substrate 52 may include a receiving region 525 that is depressed on an outer surface, surface opposing to a surface facing the first substrate 51, e.g., surface not in contact with the sealant 555, and a coupling region 526 formed around, e.g., on each side end of, the receiving region 525. That is, the coupling region 526 may protrude above the receiving region 525. For example, the coupling region 526 may be less depressed than the receiving region 525. The receiving region 525 may be shorter in terms of length than the second substrate 52, i.e., may be surrounded by the coupling region 526, which may be integral with the second substrate 52.

The first optical film 582 may be completely received, e.g., may fill in the receiving region 525 of the second substrate 52. Alternatively, only a portion of the first optical film 582 may be received in the receiving region 525. The second optical film 581 may be disposed on the second substrate 52 while covering the first optical film 582. The first optical film 582 may not be longer than the second optical film 581. A periphery of the second optical film 581, e.g., a portion not in contact with the first optical film 582, may face the coupling region 526 of the second substrate 52.

The first optical film 582 may be a phase delay film and the second optical film 581 may be a polarizer film. As described above, the external light reflection generated in the OLED display 100 may be suppressed by the polarizer film and the phase delay film. When the external light reflection is suppressed, representation of a black color and contrast may be improved, thereby improving the display properties of the OLED display.

The coupling region adhesive layer 591 may be disposed between the second optical film 581 and the coupling region 526 of the second substrate 52 to attach the second optical film 581 to the second substrate 52.

The receiving region 525 of the second substrate 52 may be depressed by a depth that is substantially same as a difference between a thickness of the coupling region adhesive layer 591 and a thickness of the first optical film 582. The overall thickness of the OLED display 100 may be reduced by the depressed depth of the receiving region 525. The receiving region 525 may be formed by etching a portion of the second substrate 52.

By the above-described structure, the overall thickness of the OLED display 100 may be reduced. That is, by forming the receiving region 525 on the second substrate 52 and receiving at least a portion of the first optical film 582 in the receiving region 525, the overall thickness of the OLED display 100 may be minimized.

Figure 2:
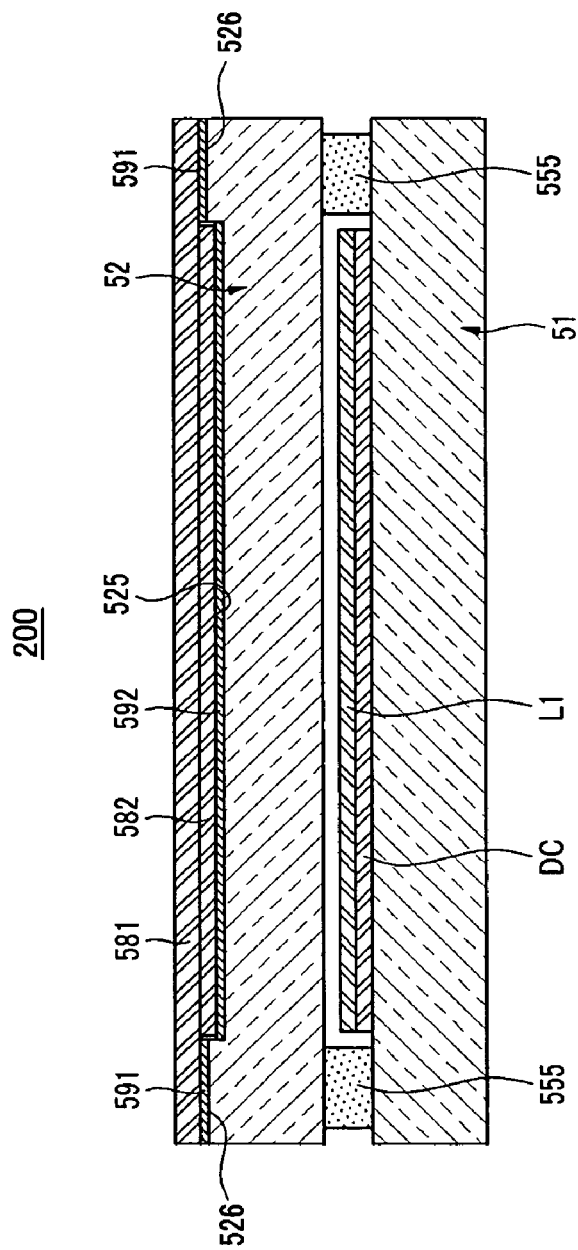
FIG. 2 illustrates a cross-sectional view of an OLED display according to a second exemplary embodiment.

The following will describe a second exemplary embodiment with reference to FIG. 2.

As illustrated in FIG. 2, an OLED display 200 in accordance with a second exemplary embodiment may further include a receiving region adhesive layer 592. Other elements are same as those illustrated in FIG. 1, and thus, details thereof are not repeated.

The receiving region adhesive layer 592 may be disposed between the first optical film 582 and the second substrate 52. That is, the receiving region adhesive layer 592 may attach the first optical film 582 received in a receiving region 525 to the second substrate 52.

The receiving region 525 of the second substrate 52 may be depressed with a depth that is substantially the same as a difference between the thickness of the coupling region adhesive layer 591 and a sum of the thickness of the first optical film 582 and the thickness of the receiving region adhesive layer 592. The depressed depth of the receiving region 525 may be greater than the depressed depth of the receiving region 525 of the first embodiment to accommodate the receiving region adhesive layer 592.

By the above-described structure, the overall thickness of the OLED display 200 may be further reduced. That is, by forming the receiving region 525 on the second substrate 52 and receiving at least a portion of the first optical film 582 and the receiving region adhesive layer 592 in the receiving region 525, the overall thickness of the OLED display 200 may be minimized.

In addition, as the receiving region adhesive layer 592 attaches the first optical film 582 to the second substrate 52, lift-off and curling of the first optical film 582 may be prevented. When the adhesion between the second optical film 581 and the second substrate 52 is deteriorated, the optical film 582 may lift off. Therefore, by attaching the first optical film 592 to the second substrate 52 using the receiving region adhesive layer 592, the lift-off and curling of the first optical film 582 may be effectively prevented and the OLED display 200 may reliably operate while being reduced in its overall thickness.

The following will describe a third exemplary embodiment.

Figure 3:
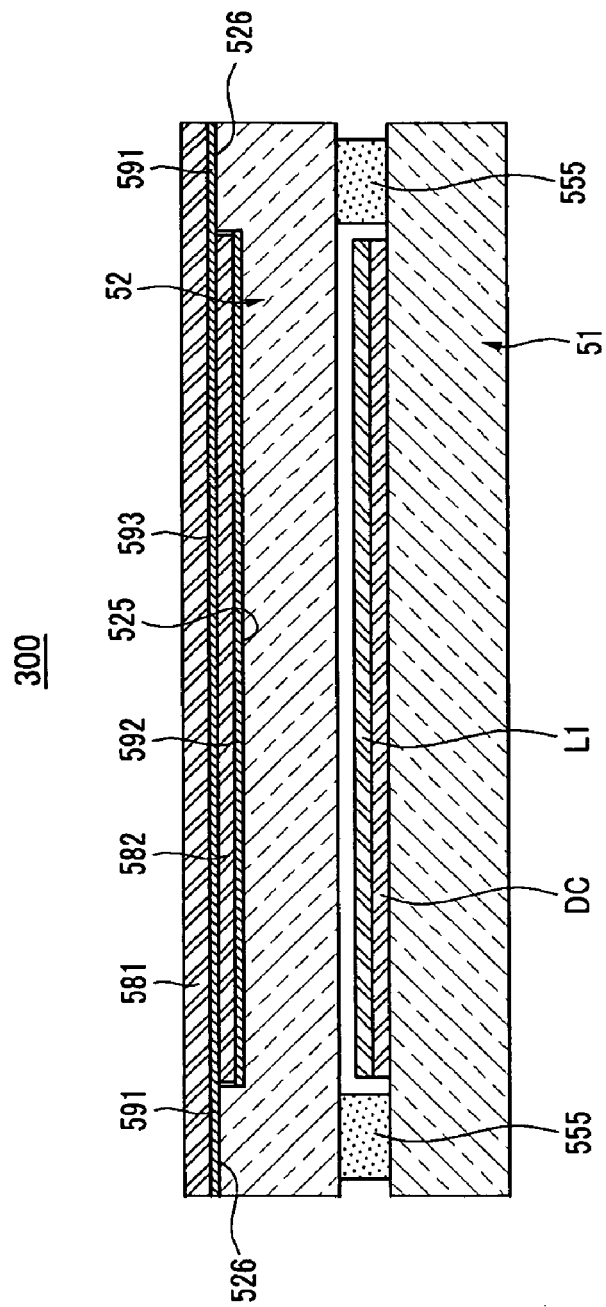
FIG. 3 illustrates a cross-sectional view of an OLED display according to a third exemplary embodiment.

As illustrated in FIG. 3, an OLED display 300 in accordance with a third embodiment may include the first substrate 51, the second substrate 52, the first optical film 582, the second optical film 581, the coupling region adhesive layer 591, and an inter-film adhesive layer 593. The OLED display 300 may further include the receiving region adhesive layer 592.

The inter-film adhesive layer 593 may be disposed between the first and second optical films 582 and 581 to attach the optical films 581 and 582 to each other. The inter-film adhesive layer 593 may be formed simultaneously with the coupling region adhesive layer 591. That is, an adhesive layer may be formed on a surface of the second optical film 581 facing the first optical film 582. A portion of the adhesive layer that faces the coupling region 526 of the second substrate 52 may become the coupling region adhesive layer 591, and a portion of the adhesive layer that faces the first optical film 582 may become the inter-film adhesive layer 593. Therefore, the thickness of the inter-film adhesive layer 593 may be same as that of the coupling region adhesive layer 591.

The receiving region 525 of the second substrate 52 may be depressed to have a depth that is substantially the same as a sum of the thickness of the first optical film 582 and the thickness of the receiving region adhesive layer 592. Therefore, the thickness of the OLED display 300 may be reduced by the depth of the receiving region 525.

In the OLED display 300 of the third exemplary embodiment, the receiving region adhesive layer 592 may be omitted. In this case, the receiving region 525 of the second substrate 52 may be depressed to have a depth that is substantially the same as the thickness of the first optical film 582. That is, in the third exemplary embodiment, the depth of the receiving region 525 is substantially the same as the total thickness of the members that will be received in the receiving region 525.

By the above-described structure, the overall thickness of the OLED display 300 may be further reduced. In addition, since the first and second optical films 582 and 581 are adhered to each other, the OLED display 300 may be structurally more stable. Therefore, the OLED display 300 may be more stable while being reduced in its thickness.

Further, since the coupling region adhesive layer 591 and the inter-film adhesive layer 593 may be formed on the entire surface of the second optical film 581, the manufacturing process may be simplified.

Figure 4:
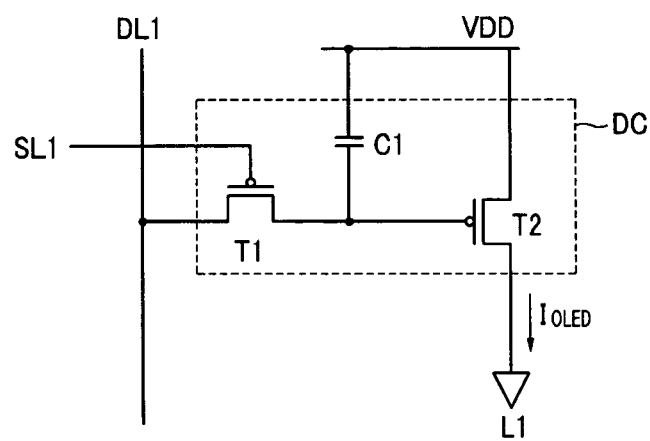
FIG. 4 illustrates a circuit diagram of a driving circuit and OLED of the OLED display of FIG. 1.
Figure 5:
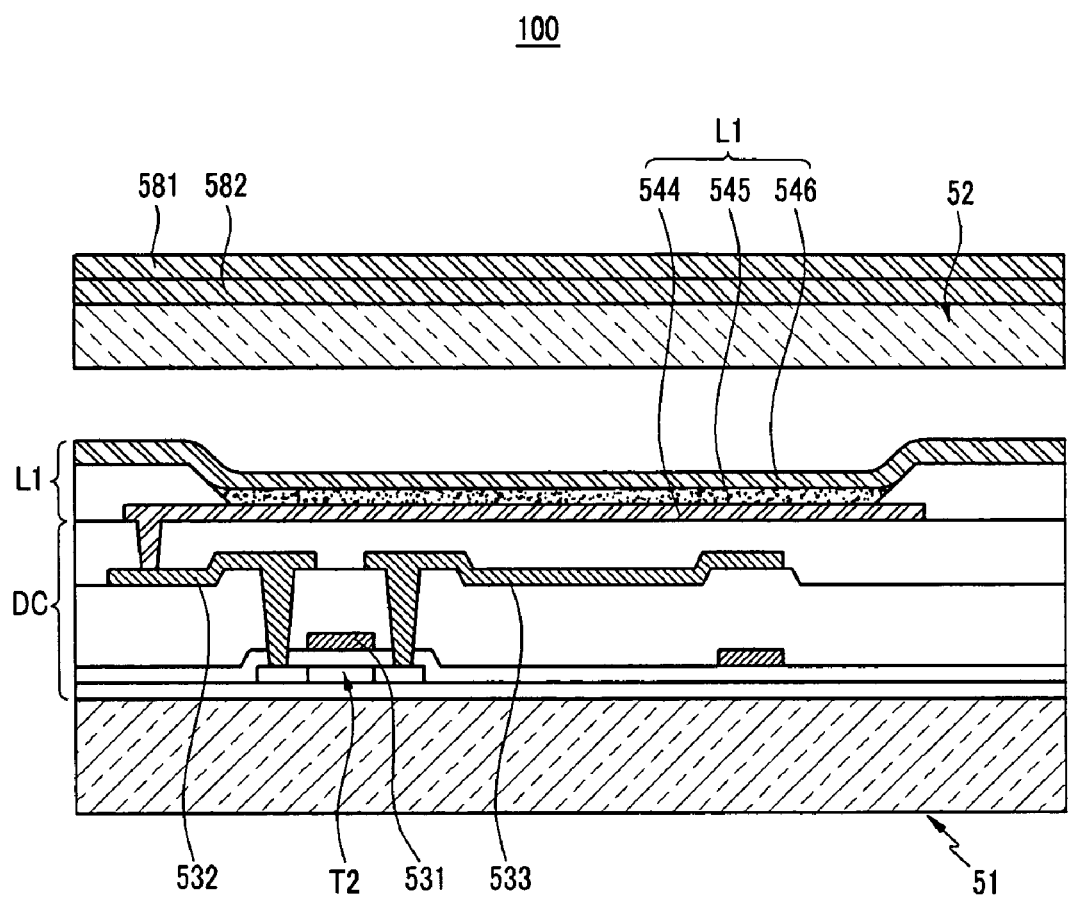
FIG. 5 illustrates an enlarged cross-sectional view of the OLED display of FIG. 1.

The following will describe the driving circuit DC and the OLED L1 of FIG. 1 with reference to FIGS. 4 and 5. The driving circuit DC and the OLED L1 may be commonly applied to other embodiments.

The driving circuit DC generally has a circuit structure as illustrated in FIG. 4. As illustrated in FIG. 4, the driving circuit may include at least two thin film transistors and at least one storage capacitor C1. The thin film transistors may include at least one switching transistor T1 and one driving transistor T2.

The switching transistor T1 may be connected to scan and data lines SL1 and DL1. The switching transistor T1 may transfer a data voltage input from the data line DL1 to the driving transistor T2 in accordance with a switching voltage input to the scan line SL1. The storage capacitor C1 may be connected to a power line VDD and the switching transistor T1 to store a voltage corresponding to a difference between a voltage transferred from the switching transistor T1 and a voltage supplied from the power line VDD.

The driving transistor T2 may be connected to the power line VDD and the storage capacitor C1 to supply an output current $I_{OLED}$, which is proportional to a square of a difference between a voltage stored in the storage capacitor C1 and a threshold voltage, to the OLED L1 so the OLED L1 may emit light by the output voltage $I_{OLED}$.

Referring to FIG. 5, the driving transistor T2 may include a source electrode 533, a drain electrode 532, and a gate electrode 531. The organic light emitting diode L1 may include a first electrode 544, an organic light emitting layer 545 formed on the first electrode 544, and a second electrode 546 formed on the organic light emitting layer 545. Generally, the first electrode 544 functions as an anode and the second electrode 546 functions as a cathode. The first electrode 544 of the organic light emitting diode L1 may be connected to the drain electrode 532 of the driving transistor T2.

While the second substrate 52 is illustrated as having the receiving region 525 and the coupling region 526 therein the first optical film 582 in accordance with the first embodiment of FIG. 1, it is to be understood that any of the embodiments may be employed.

It is to be understood that the driving circuit DC and the OLED L1 are not limited to the disclosed embodiments, but, on the contrary, the embodiments are intended to cover various modifications and various changes and equivalent arrangements that can be understood by those of ordinary skill in the art.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a first substrate;
    a second substrate adhered to the first substrate wherein a depressed receiving region and a coupling region formed around the receiving region are provided at an opposite surface to a surface facing the first substrate;
    a first optical film received in the depressed receiving region of the second substrate;
    a second optical film covering the first optical film and disposed on the second substrate; and
    a coupling region adhesive layer disposed between the second optical film and the coupling region of the second substrate.

2. The OLED display as claimed in claim 1, wherein the first optical film is a phase delay film and the second optical film is a polarizer film.

3. The OLED display as claimed in claim 1, wherein a depth of the depressed receiving region is substantially the same as a difference between a thickness of the first optical film and a thickness of the coupling region adhesive layer.

4. The OLED display as claimed in claim 1, further comprising a receiving region adhesive layer disposed between the second substrate and the first optical film in the depressed receiving region.

5. The OLED display as claimed in claim 4, wherein a depth of the depressed receiving region is substantially the same as the difference between a sum of the thickness of the first optical film and a thickness of the receiving region adhesive layer, and the thickness of the coupling region adhesive layer.

6. The OLED display as claimed in claim 1, further comprising an inter-film adhesive layer disposed between the first optical film and the second optical film.

7. The OLED display as claimed in claim 6, wherein a depth of the depressed receiving region is substantially the same as the thickness of a member received in the depressed receiving region.

8. The OLED display as claimed in claim 1, wherein the depressed receiving region is an etched region.

9. The OLED display as claimed in claim 1, wherein the first substrate includes an OLED.

* * * * *